United States Patent
Karras et al.

(10) Patent No.: US 9,503,093 B2
(45) Date of Patent: Nov. 22, 2016

(54) VIRTUALIZATION OF PROGRAMMABLE INTEGRATED CIRCUITS

(71) Applicant: Xilinx, Inc., San Jose, CA (US)

(72) Inventors: Kimon Karras, Dublin (IE); Michaela Blott, Malahide (IE); Kornelis A. Vissers, Sunnyvale, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 14/260,580

(22) Filed: Apr. 24, 2014

(65) Prior Publication Data

US 2015/0311899 A1    Oct. 29, 2015

(51) Int. Cl.
    G06F 17/50       (2006.01)
    H03K 19/177      (2006.01)

(52) U.S. Cl.
    CPC ..... H03K 19/17748 (2013.01); G06F 17/5054 (2013.01); G06F 17/5068 (2013.01); H03K 19/17724 (2013.01)

(58) Field of Classification Search
    CPC .................................................. G06F 17/5054
    See application file for complete search history.

(56) References Cited

U.S. PATENT DOCUMENTS

| | | | |
|---|---|---|---|
| 5,726,584 A | 3/1998 | Freidin | |
| 5,761,483 A | 6/1998 | Trimberger | |
| 6,828,822 B1 | 12/2004 | Bellis et al. | |
| 7,119,576 B1 | 10/2006 | Langhammer et al. | |
| 7,770,179 B1* | 8/2010 | James-Roxby | G06F 17/5054 719/312 |
| 8,415,974 B1 | 4/2013 | Lysaght | |
| 2002/0099752 A1* | 7/2002 | Markos | H04L 67/34 718/1 |
| 2003/0151426 A1* | 8/2003 | Islam | H03K 19/00323 326/37 |
| 2004/0205253 A1* | 10/2004 | Arndt | G06F 12/1491 710/1 |
| 2004/0215917 A1* | 10/2004 | Lambeth | G06F 12/0284 711/206 |
| 2005/0278680 A1* | 12/2005 | Mukherjee et al. | 716/16 |
| 2006/0064567 A1* | 3/2006 | Jacobson | G06F 12/1036 711/207 |
| 2007/0143577 A1 | 6/2007 | Smith | |

(Continued)

OTHER PUBLICATIONS

Sheldon et al., "Conjoining Soft-Core FPGA Processors". ICCAD'06, Nov. 2006. pp. 1-8.*

(Continued)

*Primary Examiner* — Vuthe Siek
*Assistant Examiner* — Aric Lin
(74) *Attorney, Agent, or Firm* — LeRoy D. Maunu

(57) ABSTRACT

A programmable IC includes a plurality of programmable resources, a plurality of shareable logic circuits coupled to the plurality of programmable resources, and a virtualization circuit. The plurality of programmable resources includes programmable logic circuits and programmable routing resources. The virtualization circuit is configured to manage sharing of the plurality of shareable logic circuits between a plurality of user designs implemented in the plurality of programmable resources. The user designs are communicatively isolated from one another on the programmable IC.

20 Claims, 6 Drawing Sheets

(56) References Cited

U.S. PATENT DOCUMENTS

| | | | |
|---|---|---|---|
| 2010/0122105 A1* | 5/2010 | Arslan | G06F 15/7867 713/500 |
| 2013/0212365 A1* | 8/2013 | Chen | G06F 17/5054 713/1 |
| 2014/0215424 A1* | 7/2014 | Fine et al. | 716/117 |
| 2014/0281055 A1* | 9/2014 | Davda et al. | 710/26 |

OTHER PUBLICATIONS

Anwer, Muhammad Bilal et al., "Building a Fast, Virtualized Data Plane with Programmable Hardware," *Proc. of the 1st ACM Workshop on Virtualized Infrastructure Systems and Architectures*, Aug. 17, 2009, pp. 1-7, ACM, New York, New York, USA.

Lee, Hyuk-Jun et al., "Scalable QoS-Aware Memory Controller for High-Bandwidth Packet Memory," *IEEE Transactions on Very Large Scale Integration (VLSI) Systems*, Mar. 2008, pp. 289-301, vol. 16, No. 3, IEEE, Piscataway, New Jersey, USA.

Llorente, Daniel et al., "Buffer allocation for Advanced Packet Segmentation in Network Processors," *International Conference on Application-Specific Systems, Architecture and Processors*, Jul. 2, 2008, pp. 221-226, IEEE, Piscataway, New Jersey, USA.

Plessl, Christian et al., "Virtualization of Hardware—Introduction and Survey," *Proc. of the International Conference on Engineering of Reconfigurable Systems and Algorithms*, Jun. 21, 2004, pp. 1-7, ERSA-ADN Publishing House, London, United Kingdom.

Shahbaz, Muhammad et al., "An Architecture for Open Source Network Tester" *2013 ACM/IEEE Symposium on Architectures for Networking and Communication Systems*, Oct. 21, 2013, pp. 123-124, , IEEE, Piscataway, New Jersey, USA.

Tan, Zhangxi et al., "A Case for FAME: FPGA Architecture Model Execution," *Proc. of the 37$^{th}$ Annual International Symposium on Computer Architecture*, Jun. 19, 2010, pp. 290-301, ACM, New York, New York, USA.

VMware, *Understanding Full Virtualization, Paravirtualization, and Hardware Assist*, Nov. 10, 2007, VMware, Palo Alto, California, USA.

Wikipedia, *IOMMU*, last modified Nov. 16, 2013, downloaded Nov. 18, 2013, pp. 1-3, http://en.wikipedia.org/wiki/IOMMU.

* cited by examiner

VIRTUALIZATION OF PROGRAMMABLE INTEGRATED CIRCUITS

TECHNICAL FIELD

The disclosure generally relates to programmable integrated circuits, and more particularly to virtualization of programmable integrated circuits.

BACKGROUND

Programmable integrated circuits (ICs) include programmable logic and routing resources that can be programmed to perform specified logic functions. One type of programmable IC, the field programmable gate array (FPGA), typically includes an array of programmable tiles. Each programmable tile typically includes both programmable interconnects and programmable logic circuits. The programmable interconnects may include a large number of interconnect lines of varying lengths interconnected by programmable interconnect points (PIPs). The programmable logic circuits implement the logic of a user design using programmable elements that can include, for example, function generators, registers, arithmetic logic, and so forth.

The programmable interconnects and programmable logic circuits are typically programmed to implement a user design by loading a configuration datastream into internal configuration memory cells that define how the programmable resources are configured. The configuration datastream can be read from memory (e.g., from an external PROM) or written into the FPGA by an external device. The collective states of the individual memory cells then determine the function of the programmable resources.

In addition to the programmable resources, an FPGA may include a number of hard-wired logic circuits that may be utilized by a user design implemented in the programmable resources. Hard-wired logic circuits may include, for example, input/output circuits, memory blocks, digital signal processing blocks (DSPs), processors, clock managers, delay lock loops (DLLs), Fourier transforms, and/or bus or network interfaces such as Peripheral Component Interconnect Express (PCIe) and Ethernet, and so forth.

SUMMARY

A programmable IC is disclosed that includes a plurality of programmable resources, a plurality of shareable logic circuits coupled to the plurality of programmable resources, and a virtualization circuit. The plurality of programmable resources includes programmable logic circuits and programmable routing resources. The virtualization circuit is configured to manage sharing of the plurality of shareable logic circuits between a plurality of user designs implemented in the plurality of programmable resources. The user designs communicatively isolated from one another on the programmable IC.

A method for virtualizing a programmable integrated circuit (IC) for a plurality of user designs is also disclosed. For each shareable logic circuits on the programmable IC, it is whether or not the shareable logic circuit is used by two or more of the plurality of user designs. A virtualization circuit is generated. The virtualization circuit is configured to manage sharing of the shareable logic circuits that are used by two or more of the plurality of user designs. A configuration data stream is generated. The configuration data stream is configured to program a set of programmable resources of the programmable IC to implement the plurality of user designs and the virtualization circuit. The plurality of user designs are communicatively isolated from one another on the programmable IC.

Another programmable IC is also disclosed that includes a plurality of programmable resources, a plurality of shareable logic circuits, and a virtualization circuit. The plurality of programmable resources includes programmable logic circuits and programmable routing resources. The plurality of hard-wired logic circuits are coupled to the plurality of programmable resources. The virtualization circuit is configured to manage sharing of the plurality of hard-wired logic circuits between a plurality of user designs implemented concurrently in the plurality of programmable resources. The user designs communicatively isolated from one another on the programmable IC.

Other features will be recognized from consideration of the Detailed Description and Claims, which follow.

BRIEF DESCRIPTION OF THE DRAWINGS

Various aspects and features of the disclosed circuits and methods will become apparent upon review of the following detailed description and upon reference to the drawings, in which.

DETAILED DESCRIPTION

Figure 1:
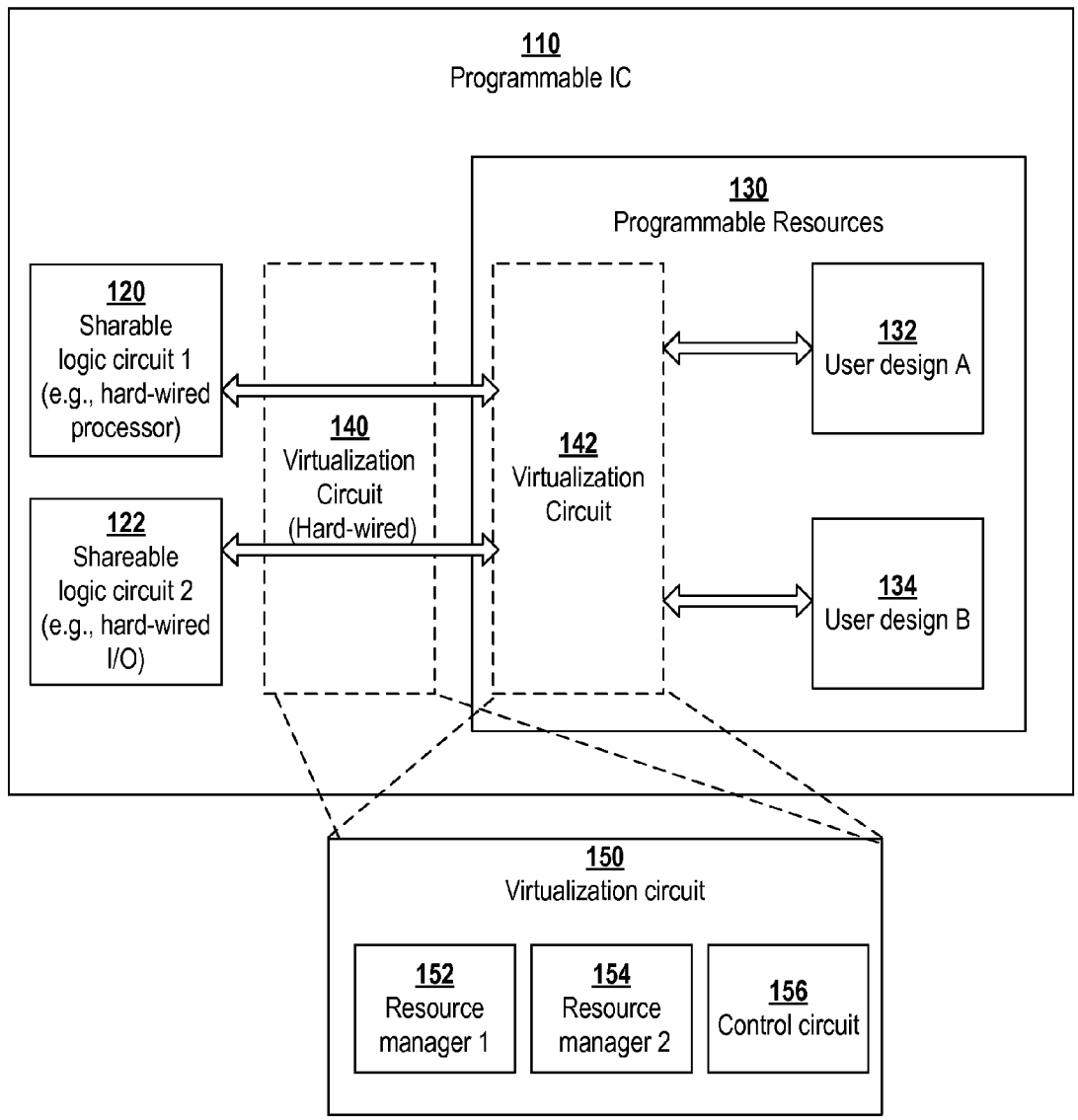
FIG. 1 shows an example programmable IC with virtualization circuitry.

Methods and circuits are disclosed for virtualization of programmable resources in a programmable IC. Virtualization allows multiple user designs to utilize resources of a programmable IC as though each user design were the only user design implemented on the programmable IC. The user designs are communicatively isolated from one another, when implemented on the programmable IC, and can each utilize the same set of logic circuits on the programmable IC without regard to other ones of the user designs.

In some implementations, a programmable IC includes a virtualization circuit for managing sharing of various logic circuits of the programmable IC between different user designs implemented in programmable resources of the programmable IC. Each of the logic circuits may be shared according to a respective resource allocation policy, which indicates how the logic circuit is to be shared between the user designs.

The logic circuits shared between different user designs may include hard-wired logic circuits included in the programmable IC, logic circuits implemented using programmable resources, external logic circuits connected to the programmable IC, or any combination thereof. For ease of reference, various logic circuits that may be shared between user designs may be referred to as shareable logic circuits. The resource allocation policies may utilize various sharing techniques. In some implementations, a respective portion of a resource of the shareable logic circuit may be assigned to each user design sharing the shareable logic circuit. Some example resources that may be assigned include, for example, memory, address space, processing cores, and/or bandwidth.

The shareable logic circuit may be time-shared between the user designs. For instance, processing time or other resources may be time-shared by scheduling respective times for each user design to use the shareable logic circuit. Resources may be time-shared according to a number of time sharing algorithms including both synchronous and asynchronous time division multiplexing algorithms.

In some implementations, the virtualization circuit includes a respective resource manager circuit for each shareable logic circuit that is shared between two or more of the user designs. The resource manager circuit is configured to enforce sharing of the shareable logic circuit between the user designs according to a resource allocation policy. In some implementations, the resource manager circuit is configured to buffer respective sets of data from the user designs that use the corresponding shareable logic circuit. For instance, a buffer circuit included in the resource manager circuit may buffer data received from a user design and provide the data to the shareable logic circuit according to the resource allocation policy. As one time-sharing example, data from a user design may be provided to the shareable logic circuit at time slots assigned to the user design in the resource allocation policy.

In some implementations, the virtualization circuit also includes a control circuit configured to set the resource allocation policies used by the resource manager circuits to direct how the shareable logic circuits are shared. In some other implementations, the resource allocation policies may be set by a control circuit external to the programmable IC.

In some implementations, at least one shareable logic circuit includes a processor shared by a set of the user designs. In such implementations, the resource manager circuit for the processor may include a circuit, such as a hypervisor, configured to cause the processor to execute instructions from each user design as a separate processing thread.

In some implementations, the resource manager circuits are configured to perform address translation between the user designs and the shared logic circuits. For instance, a hard-wired logic circuit may include a set of resources (e.g., memory blocks) having respective addresses for communication over a data bus. In some implementations, a respective subset of the addresses may be allocated for each user design. The address translation as performed by the resource manager circuits translates between a set of virtual addresses used by each of the user designs, and a corresponding subset of the physical addresses allocated for the user design. In this manner, the user designs are prevented from encroaching on the address space allocated for other ones of the user designs. The resource manager circuits also enforce access to the shareable logic circuit according to the resource allocation policy.

In various implementations, the virtualization circuit is configured to facilitate sharing of shareable logic circuits between multiple user designs that are implemented at the same time by the programmable resources. In some implementations, programmable resources may also be time-shared to implement different ones of user designs at different times. For example, the virtualization circuit may initiate partial reconfiguration of the programmable resources to time share the programmable resources between two or more user designs. Partial reconfiguration allows programmable resources to be reconfigured without resetting the programmable IC. For additional information regarding partial reconfiguration, reference may be made to U.S. Pat. No. 8,415,974, (issued Apr. 9, 2013 and entitled "Methods And Circuits Enabling Dynamic Reconfiguration"), which is fully incorporated by reference herein.

In some implementations, a design tool is configured to automatically generate a virtualization circuit configured to virtualize a programmable IC for an input set of user designs. For each of a set of shareable logic circuits on the programmable IC, the design tool determines if the shareable logic circuit is used by two or more of the input set of user designs. A virtualization circuit is generated to manage sharing of the shareable logic circuits used by multiple ones of the user designs. A configuration datastream to program a set of programmable resources of the programmable IC is then generated. The configuration data stream is configured to program the programmable resources of the programmable IC to implement the control circuit and the plurality of user designs. As indicated above, the programmable resources may implement the virtualization circuit and the plurality of user designs via a division and/or time-sharing of the programmable resources.

Though implementations are not so limited, for ease of explanation, the examples are primarily discussed and illustrated with reference to sharing of hard-wired logic circuits between multiple user designs. It is understood that the examples may be adapted to manage sharing various other shared logic circuits including, for example, logic circuits implemented with programmable resources or external logic circuits connected to the programmable IC.

Turning now to the figures, FIG. 1 shows an example programmable IC with circuitry for virtualization of the programmable IC for a plurality of user designs. The programmable IC 110 includes a set of programmable resources 130 that may be programmed to implement various user designs (e.g., 132 and 134), that are communicatively isolated from one another. In this example, the programmable IC 110 also includes two shareable logic circuits 120 and 122 that may be utilized by the user designs 132 and 134 implemented in the programmable resources 130. In this example, the shareable logic circuits 120 and 122 are hard-wired logic circuits connected to the programmable resources 130

For ones of the shareable logic circuits that are shared by multiple user designs, access to the shareable logic circuit is controlled by a virtualization circuit 150. In this example, the virtualization circuit 150 includes a respective resource manager circuit (152 or 154) for each shareable logic circuit that is shared. The resource manager circuit is configured to share the corresponding shareable logic circuit between any of the user designs that use the shareable logic circuit. In this example, the virtualization circuit 150 also includes a control circuit 156 configured to direct how sharing is performed by the resource manager circuits 152 and 154. In some implementations, the resource manager circuits 152 and 154 may be controlled by an external circuit connected to the programmable IC 110.

In some implementations, the virtualization circuit 150 is implemented as a hard-wired logic circuit 140 on the programmable IC. In some other implementations, the virtualization circuit 150 is implemented by a portion 142 of the programmable resources 130. In some implementations, a portion of the virtualization circuit 150 may be implemented by the programmable resources 130 and a portion may be implemented as a hard-wired logic circuit 140. For example, an allocation/scheduling circuit may be implemented as a hard-wired logic circuit and appropriate buffer circuits may be implemented using programmable resources.

In this example, two user designs 132 and 134 are implemented concurrently in the programmable resources 130. However, various implementations may implement a larger number of user designs in programmable resources. Furthermore, in some implementations, programmable resources may also be time-shared to implement different user designs at different times.

Figure 2:
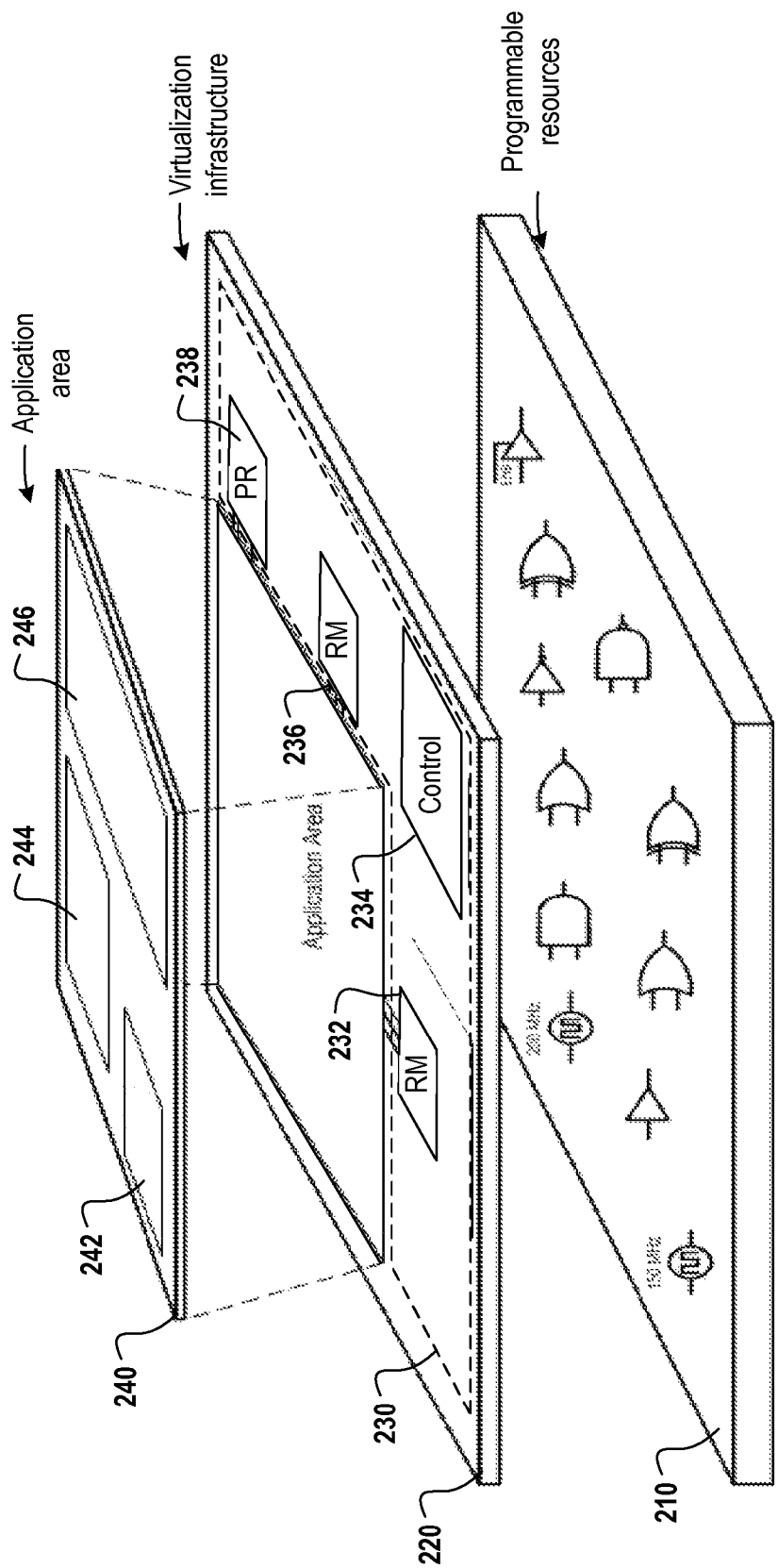
FIG. 2 shows an arrangement of programmable resources to provide a virtualization infrastructure.

FIG. 2 shows an arrangement of programmable resources to provide a virtualization infrastructure for virtualization of a programmable IC for a plurality of user designs. The programmable resources 210 may be programmed to implement various circuits. A portion of the programmable resources are programmed to provide virtualization infrastructure 220. The virtualization infrastructure 220 provides a subset of programmable resources in an application area 240 that may be used to implement a plurality of user designs 242, 244, and 246. The virtualization infrastructure 220 also includes a virtualization circuit 230 configured to manage sharing of various shareable logic circuits, which are connected to the programmable resources 210. More specifically, the shareable logic circuits are shared between the user designs (242, 244, and 246).

The virtualization circuit 230 includes resource manager circuits 232 and 236, which are configured to share a respective shareable logic circuit between two or more of the user designs 242, 244, and 246. In this example, the virtualization circuit 230 also includes a circuit 238 for partial reconfiguration of programmable resources in the application area 240. In some implementations, the virtualization circuit 230 also includes a control circuit 234 configured to direct how sharing is performed by the resource manager circuits 232 and 236 and to direct the partial reconfiguration performed by circuit 238. In some other implementations, the resource manager circuits and/or the partial reconfiguration circuit may be controlled by a circuit connected to the programmable resources on the programmable IC or by a circuit connected to the programmable IC.

Figure 3:
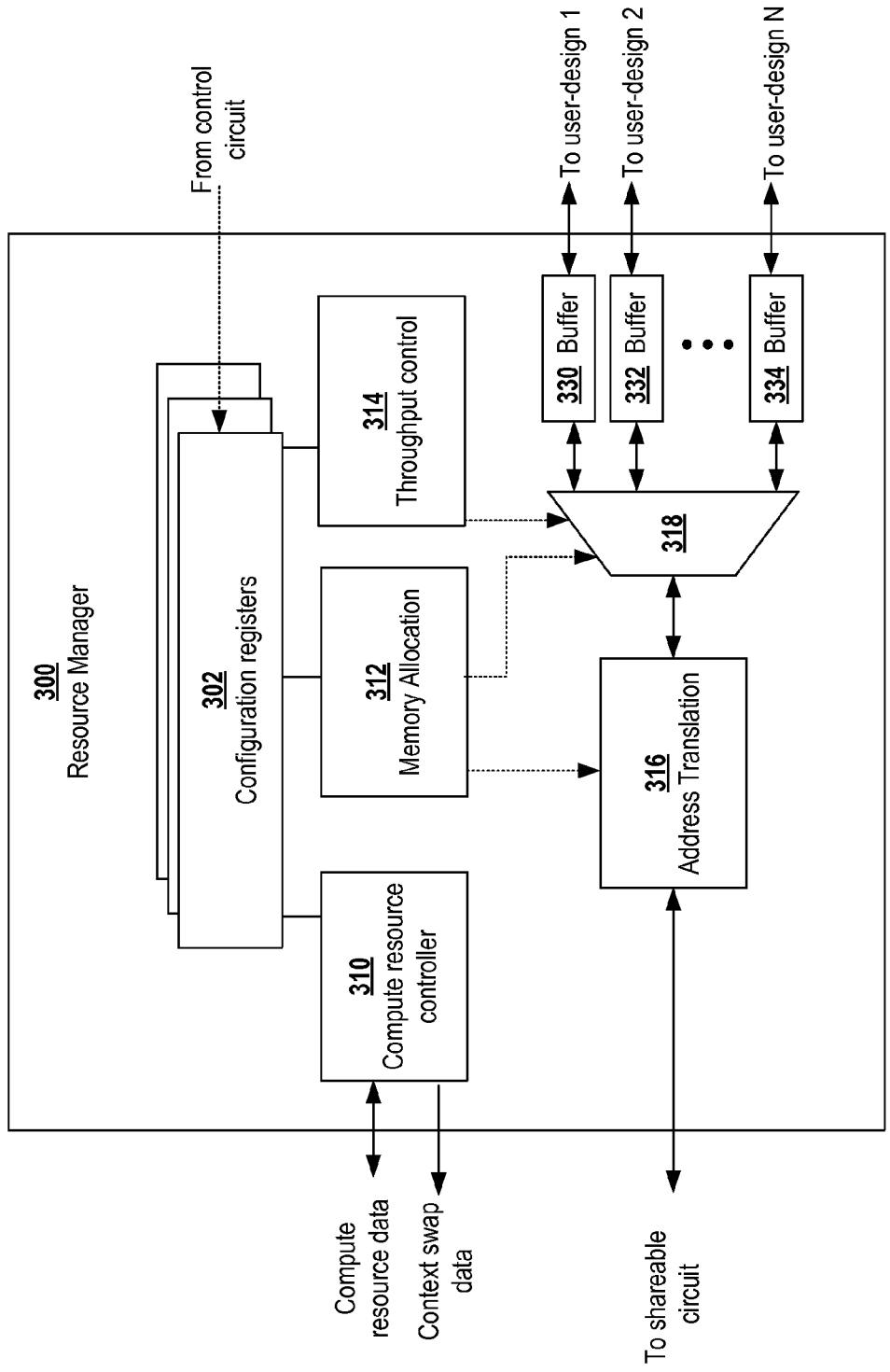
FIG. 3 shows an example resource manager circuit for managing shared access to a shareable logic circuit.

FIG. 3 shows an example circuit for managing access to a shareable logic circuit. The resource manager circuit 300 may be used, for example, to implement the resource manager circuits shown in FIG. 1. In this example, the resource manager circuit 300 includes a set of buffers 330, 332, and 334 for buffering data received from respective user designs. The buffers may be used, for example, to buffer data when time-sharing user designs are swapping.

The resource manager circuit 300 also includes a selection circuit 318 configured to provide data from the buffers 330, 332, and 334 to a shareable logic circuit according to a resource allocation policy that indicates how the shareable logic circuit is to be shared. As indicated above, the resource allocation policy may allocate resources for the user designs using various sharing techniques including, for example, timesharing of resources or allocating subsets of resources to specific user designs.

In some implementations, the resource manager circuit 300 includes a circuit to allocate a respective portion of resources of the shareable logic circuit to each of the user designs. For example, the resource manager circuit 300 may include a throughput control circuit 314 configured to cause the selection circuit 318 to provide data from the buffer circuits 330, 332, and 334 to the shareable logic circuit, for example, to maximize throughput or enforce a bandwidth allocation indicated in a resource allocation policy.

As another example, the resource manager circuit 300 may include a memory allocation circuit 312 configured to allocate a respective set of memory addresses for each of the user designs (1-N). Address translator 316, is configured to translate between a set of virtual addresses used by the user designs and the respective sets of memory addresses allocated for the user designs (1-N).

In some implementations, the resource manager circuit 300 includes a compute resource controller 310 configured to facilitate sharing of computing resources (e.g., a processor) of a shareable logic circuit. For instance, in some implementations, the compute resource controller 310 may be configured to coordinate with a hypervisor circuit to facilitate context swaps between different user designs. In some implementations, the compute resource controller 320 may operate as a hypervisor to cause a processor to process data from each user design in a separate processing thread.

In some implementations, configuration settings for the compute resource controller 310, memory allocation circuit 312, and/or throughput control circuit 314 are stored in a set of configuration registers 302. The configuration settings stored in the configuration registers 302 may be set/adjusted, for example, by an external control circuit.

Figure 4:
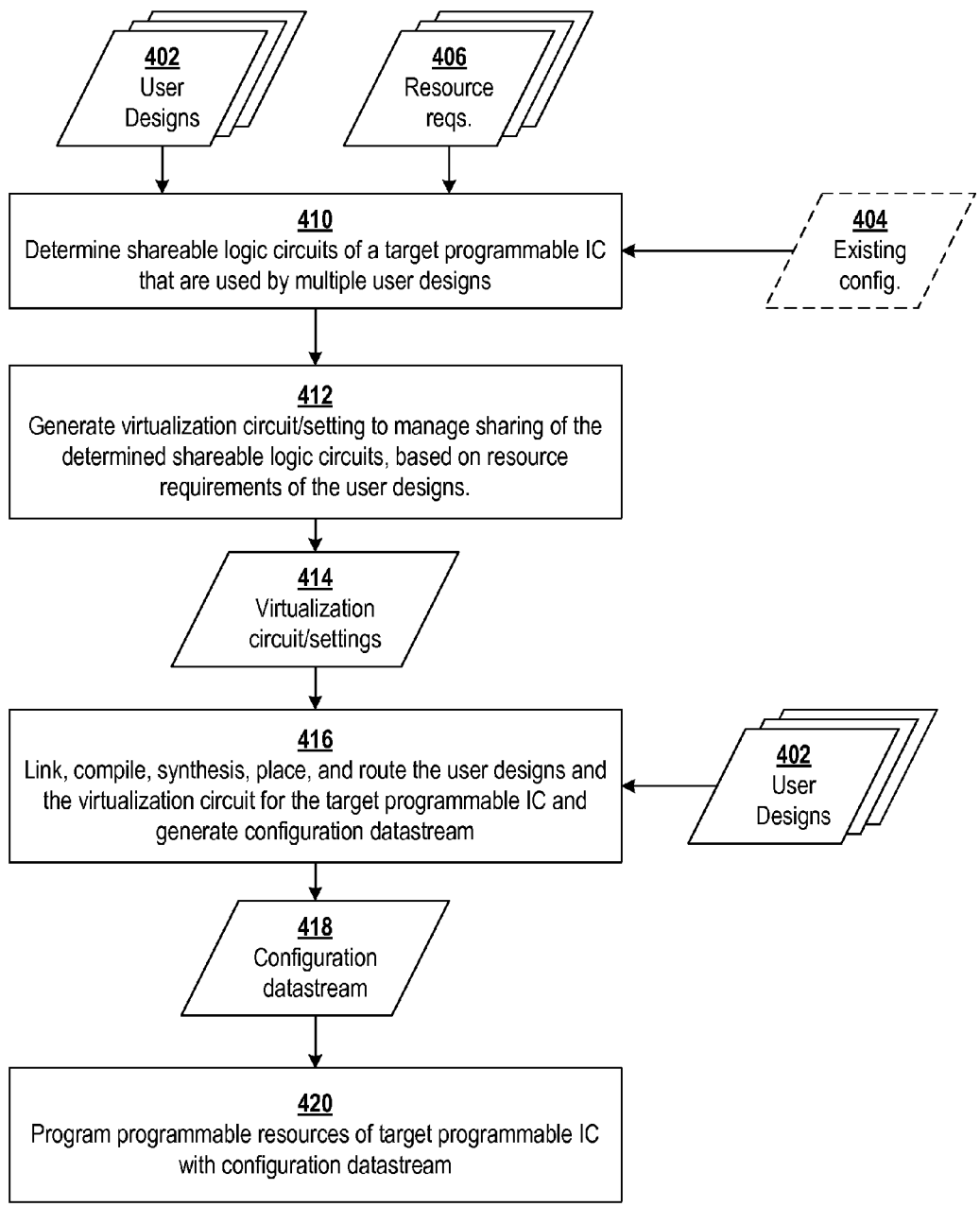
FIG. 4 shows a process for generating a circuit for virtualizing a programmable IC for a plurality of user designs.

FIG. 4 shows a process for generating control circuits for virtualization of a programmable IC for a plurality of user designs. At block 410, shareable logic circuits (e.g., hard-wired logic circuits) of a target programmable IC that are used by multiple ones of an input set of user designs 402 are determined. Each user designs 202 may have a set of resource requirements 406 indicating an allocation of resources of the shareable logic circuit (e.g., bandwidth, address space, processing time) that are required by the user design. At block 412, a virtualization circuit/settings 414 are generated to manage sharing of the determined shareable logic circuits, based on resource requirements 406 for each of the user designs. At block 416, the user designs 402 and the virtualization circuit are linked, compiled, synthesized, placed, and routed for implementation on the target programmable IC. As previously indicated, the user designs 402 may be implemented simultaneously by programmable resources of the target programmable IC or may implement different sets of user designs at different times via partial reconfiguration. Also at block 416, a configuration datastream 418 is generated to program the target programmable IC to implement the placed and routed design. At block 420, programmable resources of the programmable IC are programmed with the configuration data stream 418. The configuration datastream 418 may program the entire set of programmable resources on the target programmable IC or may program only a subset of the programmable resources.

In some implementations, user designs included in an existing configuration 404 of the target programmable IC may also be input at block 410 along with user designs 402. In such a scenario, block 410 determines sharable logic circuits used by multiple ones of existing or new user designs. At block 412, a virtualization circuit/settings 414 are generated to manage sharing of the determined shareable logic circuits, as discussed above. In some instances, the addition of new user designs 402 to be added to an existing configuration 404 will not require generation of new virtualization circuits but rather will only require sharing settings to be adjusted.

Figure 5:
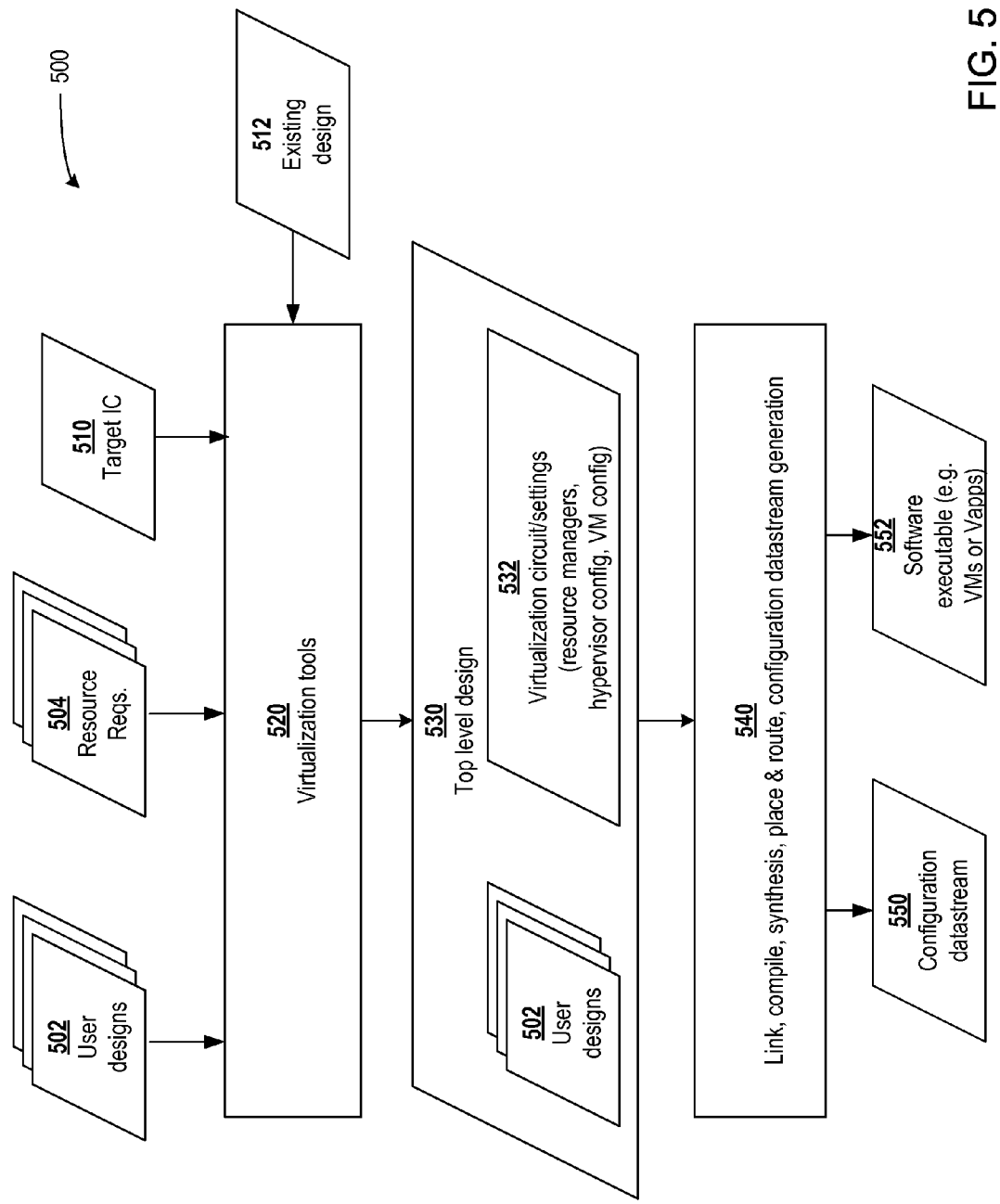
FIG. 5 shows a block diagram flow of a design tool for generating a circuit for virtualization of a programmable IC for a plurality of user designs.

FIG. 5 shows a block diagram flow of a design tool for generating circuits for virtualization of a programmable IC for a plurality of user designs. The design tool 500 includes virtualization tools 520 configured to receive a set of user designs 502, resource requirements 504 for the user designs, and an existing design 512 (if available). As described with reference to blocks 410 and 412 in FIG. 4, the virtualization tools 520 generate top-level design 530 including user designs 502 and a virtualization circuit 532. The virtualization circuit 532 is configured to manage sharing of shareable logic circuits of a target programmable IC 510 that are used by multiple ones of the user designs 502. The virtualization circuit may include a resource manager circuit for each shareable logic circuit. In some implementations, a hypervisor and/or virtual machine configuration data may also be generated.

The design tool also includes a tool 540 for linking, compiling, synthesizing, placing, and routing the user designs 502 and the virtualization circuit 532 for the target programmable IC 510. The tool 540 is also configured to generate a configuration datastream 550 to implement the user designs 502 and the virtualization circuit 532 on the target programmable IC. In some scenarios, e.g., where the programmable IC includes a processor for execution of a software portion of user designs, executable software 552 (virtual machine software) may also be generated.

Figure 6:
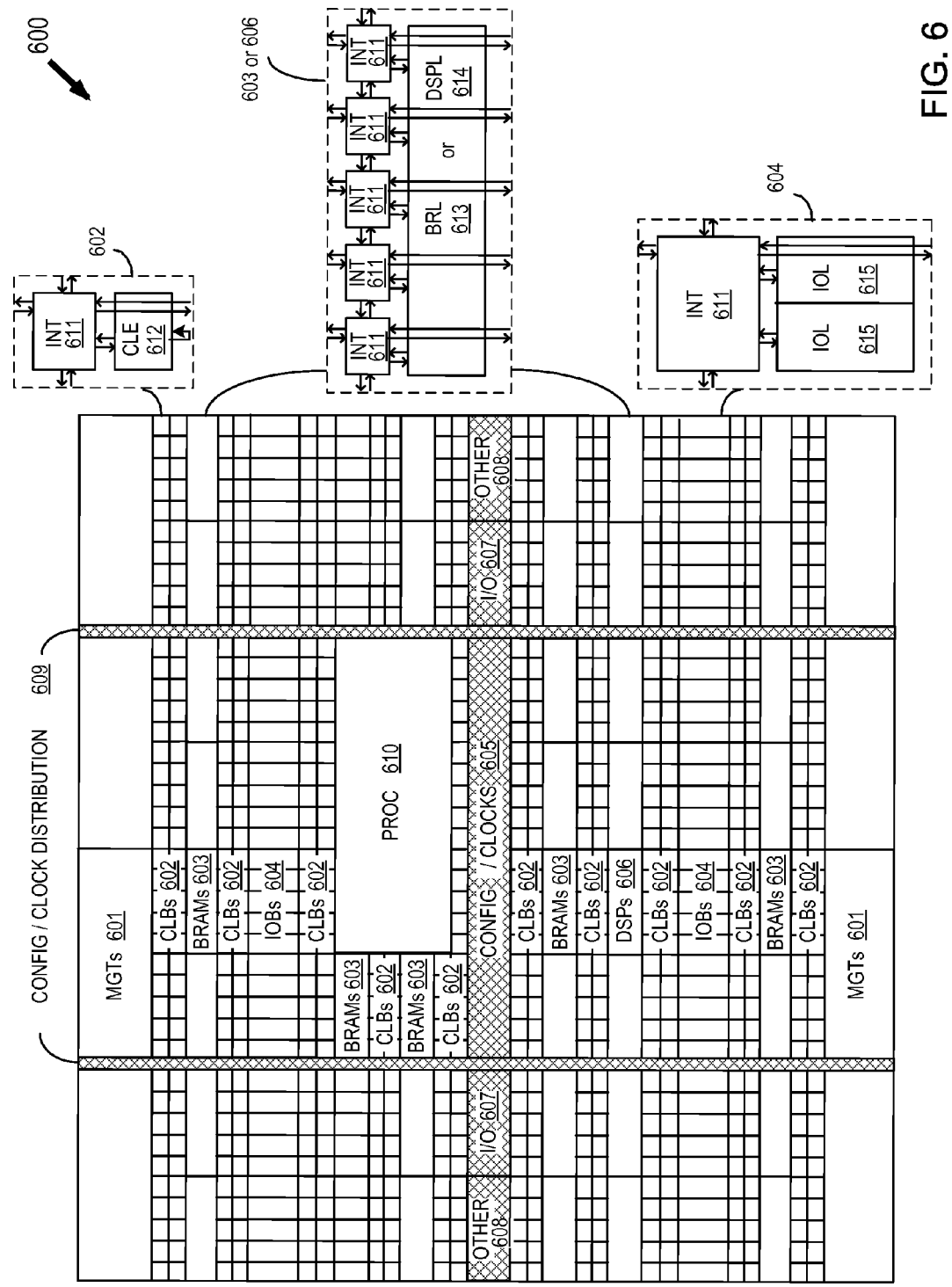
FIG. 6 shows an FPGA that may be configured in accordance with the circuit structures disclosed herein.

FIG. 6 shows an FPGA that may be configured in accordance with the circuit structures disclosed herein. Note, however, that the circuits and methods described herein are not limited to FPGAs. This description is provided merely as an example of a programmable IC to which the circuits and methods described herein may be applied. The FPGA architecture (600) of FIG. 6 includes a large number of different programmable tiles including multi-gigabit transceivers (MGTs) 601, configurable logic blocks (CLBs) 602, random access memory blocks (BRAMs) 603, input/output blocks (IOBs) 604, configuration and clocking logic (CONFIG/CLOCKS) 605, digital signal processing blocks (DSPs) 606, specialized input/output blocks (I/O) 607, for example, clock ports, and other programmable logic 608 such as digital clock managers, analog-to-digital converters, system monitoring logic, and so forth. Some FPGAs also include dedicated processor blocks (PROC) 610 and internal and external reconfiguration ports (not shown).

In some FPGAs, each programmable tile includes a programmable interconnect element (INT) 611 having standardized connections to and from a corresponding interconnect element in each adjacent tile. Therefore, the programmable interconnect elements taken together implement the programmable interconnect structure for the illustrated FPGA. The programmable interconnect element INT 611 also includes the connections to and from the programmable logic element within the same tile, as shown by the examples included at the top of FIG. 6.

For example, a CLB 602 can include a configurable logic element CLE 612 that can be programmed to implement user logic, plus a single programmable interconnect element INT 611. A BRAM 603 can include a BRAM logic element (BRL) 613 in addition to one or more programmable interconnect elements. Typically, the number of interconnect elements included in a tile depends on the height of the tile. In this example, a BRAM tile has the same height as five CLBs, but other numbers (e.g., four) can also be used. A DSP tile 606 can include a DSP logic element (DSPL) 614 in addition to an appropriate number of programmable interconnect elements. An IOB 604 can include, for example, two instances of an input/output logic element (IOL) 615 in addition to one instance of the programmable interconnect element INT 611. As will be clear to those of skill in the art, the actual I/O bond pads connected, for example, to the I/O logic element 615, are manufactured using metal layered above the various illustrated logic blocks, and typically are not confined to the area of the input/output logic element 615.

In this example, a columnar area near the center of the die (shown shaded in FIG. 6) is used for configuration, clock, and other control logic. Horizontal areas 609 extending from this column are used to distribute the clocks and configuration signals across the breadth of the FPGA.

Some FPGAs utilizing the architecture illustrated in FIG. 6 include additional logic blocks that disrupt the regular columnar structure making up a large part of the FPGA. The additional logic blocks can be programmable blocks and/or dedicated logic. For example, the processor block PROC 610 shown in FIG. 6 spans several columns of CLBs and BRAMs.

Note that FIG. 6 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 6 are purely exemplary. For example, in an actual FPGA, more than one adjacent column of CLBs is typically included wherever the CLBs appear, to facilitate the efficient implementation of user logic.

The methods and circuits disclosed herein are thought to be applicable to a variety of systems and applications which utilize programmable IC and/or virtualization. Other aspects and features will be apparent to those skilled in the art from consideration of the specification. The methods and circuits may be implemented as one or more processors configured to execute software, as an application specific integrated circuit (ASIC), or as a logic on a programmable logic device. It is intended that the specification and drawings be considered as examples only, with a true scope of the invention being indicated by the following claims.

What is claimed is:

1. A programmable integrated circuit (IC), comprising:
a configuration memory;
a plurality of programmable resources including programmable logic circuits and programmable routing resources, wherein in response to a configuration datastream being loaded into the configuration memory, the programmable resources are configured to concurrently implement two or more different user designs of a plurality of user designs specified in the configuration datastream using respective subsets of the programmable resources;
a plurality of shareable logic circuits coupled to the plurality of programmable resources, wherein the plurality of sharable logic circuits are exclusive from the respective subsets of the programmable resources used to implement the two of more user designs;
a virtualization circuit configured to manage sharing of access to the plurality of shareable logic circuits between the two or more user designs according to a resource allocation policy derived from the configuration datastream; and
wherein the plurality of user designs are communicatively isolated from one another on the programmable IC.

2. The programmable IC of claim 1, wherein:
the sharable logic circuits are hard-wired circuits coupled to the programmable resources on the programmable IC;
the virtualization circuit includes a respective resource manager circuit for each of the shareable logic circuits that is used by the two or more of the plurality of user designs;

each resource manager circuit is configured to:
  buffer respective sets of data from the plurality of user designs that use the corresponding shareable logic circuit; and
  provide the respective sets of data to the shareable logic circuit according to the resource allocation policy.

3. The programmable IC of claim 2, wherein
the plurality of shareable logic circuits includes at least one hard-wired logic circuit;
the programmable resources are further configured to implement a control circuit configured to set the resource allocation policy of each resource manager circuit.

4. The programmable IC of claim 2, wherein the resource allocation policy indicates at least one of an allocation of bandwidth, address space, or processing time cycles of the shareable logic circuit.

5. The programmable IC of claim 2, wherein:
at least one of the shareable logic circuits is a processor; and
the respective resource manager circuit for the processor includes a hypervisor configured share processing time between ones of the plurality of user designs that use the processor.

6. The programmable IC of claim 2, wherein each of the resource manager circuits is configured to:
perform address translation between respective addresses used by the plurality of user designs for communication with the corresponding shareable logic circuit and an address used by the corresponding shareable logic circuit for communication; and
enforce access to the shareable logic circuit by the plurality of user designs according to the resource allocation policy.

7. The programmable IC of claim 1, wherein the virtualization circuit is configured to manage time sharing of the plurality of programmable resources between at least two of the plurality of user designs via partial reconfiguration.

8. The programmable IC of claim 1, wherein the virtualization circuit is implemented by a subset of the plurality of programmable resources.

9. The programmable IC of claim 1, wherein the virtualization circuit is a hard-wired logic circuit connected to the plurality of programmable resources.

10. The programmable IC of claim 1, wherein the plurality of shareable logic circuits includes a plurality of hard-wired logic circuits.

11. The programmable IC of claim 1, wherein each of the plurality of shareable logic circuits is one of a set of circuits including: an input/output circuit, a memory, and a processor.

12. The programmable IC of claim 1, wherein at least two of the plurality of user designs are implemented concurrently in the plurality of programmable resources.

13. A method for virtualizing a programmable integrated circuit (IC) for a plurality of user designs, comprising:
identifying a subset of sharable logic circuits, in a set of shareable logic circuits on the programmable IC, that are each used by two or more of the plurality of user designs during operation;
generating a virtualization circuit configured to manage sharing of access to the subset of shareable logic circuits by the two or more of the plurality of user designs according to a resource allocation policy derived from the configuration datastream;
generating a configuration data stream to program a set of programmable resources of the programmable IC to concurrently implement the plurality of user designs and the virtualization circuit;
wherein the two or more of the plurality of user designs are implemented concurrently by respective subsets of the set of programmable resources;
wherein the set of sharable logic circuits are exclusive from the respective subsets of the set of programmable resources; and
wherein the plurality of user designs are communicatively isolated from one another on the programmable IC.

14. The method of claim 13, further comprising:
programming the set of programmable resources using the configuration data stream; and
for each of the shareable logic circuits that is used by two or more of the plurality of user designs, using the virtualization circuit to:
buffer respective sets of data from the plurality of user designs which use the corresponding shareable logic circuit, and
provide the respective sets of data to the shareable logic circuit according to a resource allocation policy; and
wherein the shareable logic circuits include one or more hard-wired logic circuits.

15. The method of claim 14, wherein the resource allocation policy indicates an allocation of bandwidth, address space, or processing time of the shareable logic circuit.

16. The method of claim 14, further comprising:
using, for each of the shareable logic circuits that is used by two or more of the plurality of user designs, the virtualization circuit to perform address translation and enforce access to the corresponding shareable logic circuit according to the resource allocation policy.

17. The method of claim 13, wherein the configuration data stream is configured to implement in the set of programmable resources, at the same time, at least two of the plurality of user designs that both use a same one of the shareable logic circuits.

18. The method of claim 13, further comprising using the virtualization circuit to manage time sharing of the set of programmable resources between at least two of the plurality of user designs via partial reconfiguration.

19. The method of claim 13, further comprising:
programming the programmable IC with the configuration data stream;
receiving an additional set of user designs;
for each of the set of shareable logic circuits on the programmable IC, determining if the shareable logic circuit is used by multiple user designs included in either the plurality of user designs or the additional set of user designs;
generating a second virtualization circuit configured to manage sharing of the shareable logic circuits that are used by two or more of the plurality of user designs; and
generating a second configuration data stream to program a set of programmable resources of the programmable IC to implement the plurality of user designs, the additional set of user designs and the second virtualization circuit.

20. A programmable integrated circuit (IC), comprising:
a plurality of programmable resources, including programmable logic circuits and programmable routing resources, configured and arranged to implement circuits of a plurality of user designs specified by an input configuration datastream;
a plurality of hard-wired logic circuits coupled to the plurality of programmable resources; and a virtualization circuit configured to manage sharing of the plurality of hard-wired logic circuits between the plurality of user designs implemented concurrently in the plurality of programmable resources according to a resource allocation policy derived from the configuration datastream;

wherein the plurality of user designs are communicatively isolated from one another on the programmable IC.

* * * * *